United States Patent [19]

Scire et al.

[11] Patent Number: 4,559,717
[45] Date of Patent: Dec. 24, 1985

[54] FLEXURE HINGE

[75] Inventors: Fredric E. Scire, Frederick; E. Clayton Teague, Gaithersburg, both of Md.

[73] Assignee: The United States of America as represented by the Secretary of Commerce, Washington, D.C.

[21] Appl. No.: 581,831

[22] Filed: Feb. 21, 1984

[51] Int. Cl.[4] ............................................. G01B 5/00
[52] U.S. Cl. ..................................... 33/568; 33/1 M; 350/531
[58] Field of Search ................ 33/568, 1 M, 568, 569, 33/573, 180 R, 174 TA; 308/2 A, 3 A; 269/58; 356/244, 252; 355/53; 16/225, DIG. 13; 350/521, 531; 108/137, 143

[56] References Cited

U.S. PATENT DOCUMENTS 4,320,943  3/1982  Link ................................. 353/25 X

FOREIGN PATENT DOCUMENTS 0150161  11/1979  Japan ................................. 33/169 R
0013301  1/1982  Japan ..................................... 33/568
0096202  6/1983  Japan ............................. 33/174 TA

OTHER PUBLICATIONS

IBM Tech. Bull., "Frictionless X,Y,Z Table" by Aronstein et al., vol. 15 No. 12, 5/73.

IBM Tec. Bul., "Step & Repeat Micro Table", vol. 12, #11, 4/70.

Primary Examiner—Harry N. Haroian
Attorney, Agent, or Firm—Eugene J. Pawlikowski; Alvin J. Englert; Ira C. Edell

[57] ABSTRACT

An improved flexure hinge permits both angular pivoting and longitudinal expansion and contraction and is made of a body member of solid material which is normally not flexible or expandable. A first recess is defined part-way through the body member at one longitudinally extending edge opposite second and third recesses defined through the opposite longitudinally-extending edge of the body member. The first recess is separated from each of the second and third recesses by web-like portions which are sufficiently thin to permit flexure of the body member about respective first and second axes extending through the first and second web portions, respectively. A stage, moveable along a single axis, employs four such body members, each body member having two double web hinge devices, one double web device being located at each end of the body member. The four body members are disposed symmetrically about the axis along which the stage is moved, and symmetrically about a transverse axis. The body members extend to the stage member from a surrounding frame.

24 Claims, 6 Drawing Figures

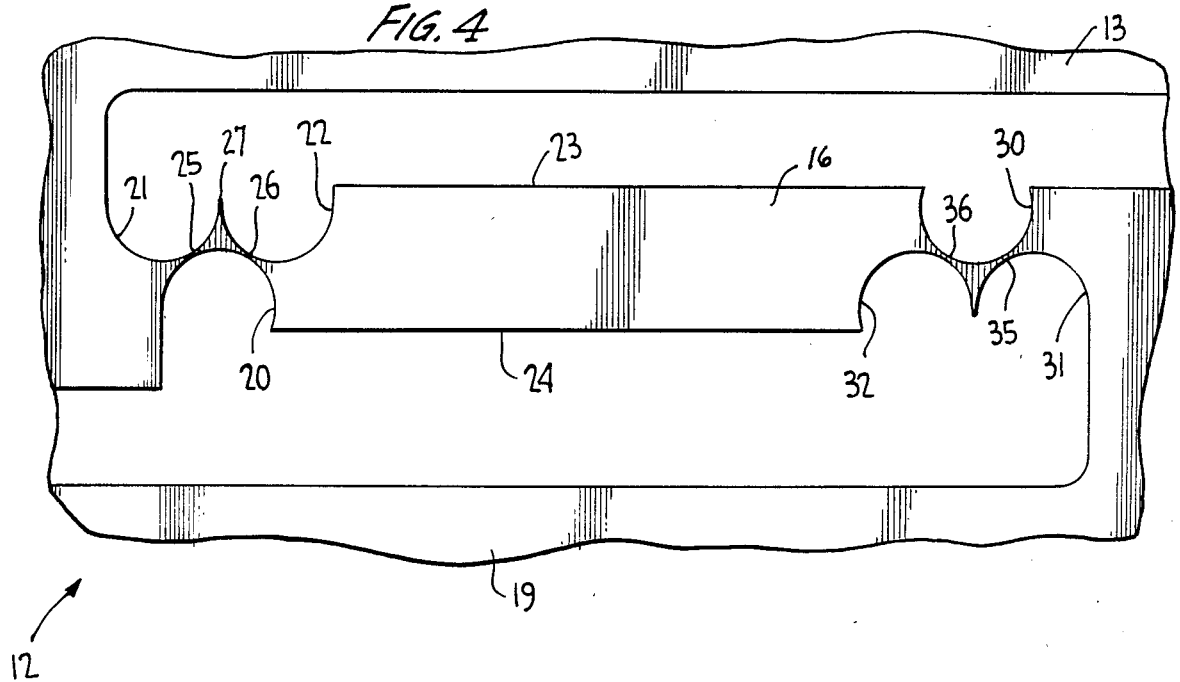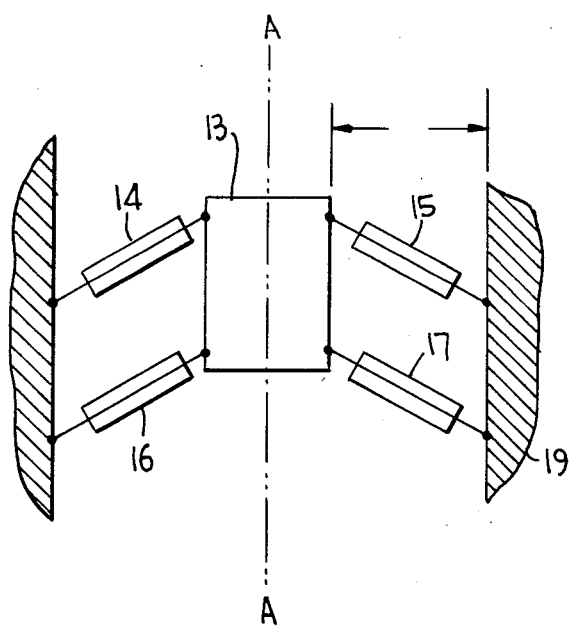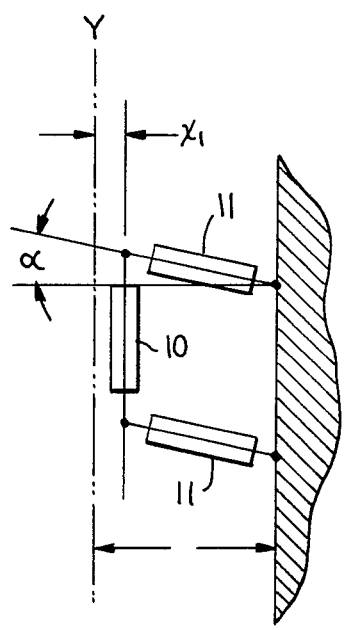

FLEXURE HINGE

BACKGROUND OF THE INVENTION

1. Technical Field

The present invention relates to improved flexure devices as well as to the use of such devices in instrument stages capable of independent movement in each of two orthogonally/related dimensions. More particularly, the invention relates to an instrument stage having an output device form capable of independent xy motion in a single plane and which is virtually free of pitch, roll and yaw and of motion perpendicular to the plane of motion.

2. Discussion of the Prior Art

The flexure device of the present invention is an improvement over the flexure hinges described and illustrated in a publication by Paros, et al. entitled: "HOW TO DESIGN FLEXURE HINGES" which appeared in the Nov. 25, 1965 issue of MACHINE DESIGN magazine at pages 151–156, inclusive. The subject matter of that publication is expressly incorporated herein by reference in its entirety.

The flexure hinges described in the aforementioned Paros, et al. publication permit angular flexure in a member made of normally non-flexible material. The angular flexure is achieved by providing cut-outs or recesses from opposite edges of the member, which cut-outs or recesses are separated by a web-like section that is sufficiently thin to provide the desired angular flexure capability. The recesses may be of circular or rectangular cross-section and define a flexure pivot axis which extends transversely through the web. A two-axis flexure may be provided by using two pairs of such cut-outs or recesses, each pair being defined to a different pair of edges of the member. As described in the Paros et al. publication, the thinnest part of the web may be lapped down to a thickness of 500 micro inches.

There are applications for flexure devices which require the device to flex not only angularly but lengthwise. For example, in an instrument stage, it is often desirable to move a platform in each of the x and y dimensions independently in a single plane. More specifically, in measuring surface microtopography, in order to survey a surface area accurately, the scanning stage used to move the specimen surface under a fixed stylus must move in a true horizontal plane, and orthogonality of axis motion should require no corrective servo control. For example, referring to FIG. 6 of the accompanying drawings, it is desirable that the stage, diagrammatically represented by the reference numeral 10, be movable along the y-axis, for example, without any x-axis displacement. It has been suggested that flexure hinges 11 of the type disclosed by Paros, et al. be employed so that they may be pivoted through an angle to permit the desired y-axis displacement. However, as seen in FIG. 6, angular flexure alone of hinges 11 produces off-axis displacement $x_1$ as well as the desired movement on-axis. Specifically, hinges 11 are unable to expand in length and therefore cannot accomodate the desired movement of the stage solely along the y-axis. Thus, the Paros, et al. flexure hinges cannot serve the intended function described hereinabove. This is unfortunate in view of the fact that such hinges are quite valuable where angular motion about a compliant axis is limited and zero friction and backlash are of paramount importance. Moreover, such hinges, compliant about the desired pivot axis, are substantially rigid about the cross-axis.

One could, of course, build a two-axis instrument stage using mechanical sliding joints, ball bearings, lubricants, etc. However, such expedients tend to be unreliable, have "stick-slip" friction, excessive bearing noise, require continuous calibration adjustment, and are not consistent with applications requiring a vacuum environment such as is present in a scanning electron microscope.

OBJECT AND SUMMARY OF THE INVENTION

It is therefore an object of the present invention to provide an improved flexure device which provides the desired compliance about one pivot axis, rigidity about a cross axis, but is expandable in length.

It is another object of the present to provide a modified flexure hinge of the general type described above but which is characterized by an additional degree of controlled movement, this movement being along the lengthwise axis of the device.

A further object of the present invention is to provide a two-axis instrument stage which permits selective displacement along either axis independently without requiring mechanical sliding joints, ball bearings, or other relatively moveable, frictionally engaged parts. Still another object of the present invention is to provide an x-y positioning stage employing flexure hinges of the general type described but which are improved to permit axial expansion and contraction of the hinge to prevent off-axis movement of the stage.

In accordance with the present invention, an improved flexure hinge includes two flexure hinges of the general type disclosed by Paros, et al., both hinges being pivotable about mutually parallel axes which are displaced lengthwise along the body member in which the hinges are formed. In the preferred embodiment, each pair of hinges is formed by three cut-outs or recesses, a first of which extends from one longitudinally-extending edge of the body member, the other two extending from the opposite edge. A pivot web is formed between the first recess and each of the other two recesses.

If one end of the body member is pivotably fixed, and if the other end is secured to a stage, or the like, which is to move generally perpendicular to the nominal lengthwise dimension of the body member, the double pivot joint permits the body member to contract or expand lengthwise as required to accomodate the on-axis movement of the stage. This presupposes that the stage is constrained in some manner to move along the desired axis without moving off that axis. Such constraint is achieved by placing the flexure hinges of the present invention on both sides of the stage to pivot and vary in length as necessary to accomodate lineal stage movement while proper symmetrical placement of the body members prevents off-axis displacement. The body members are preferably disposed with a double flexure joint, as described above, at each end of the body member to permit the necessary degree of pivoting and lengthwise variation. Moreover, the different body members employed to support each stage are preferably as identical as possible to provide symmetry in the support mechanism for the stage.

In a preferred embodiment, a first stage is supported for movement along a first axis within a frame by means of four body members disposed between the stage and the frame, two body members being disposed on each side of the first axis in symmetrical relation about that axis. Each body member has a double flexure joint of the present invention at each of its ends. The first stage serves as a frame for a second stage similarly mounted interiorly of the first stage with flexure joints disposed symmetrically about a second motion axis positioned coplanar with and preferably orthogonally to the first axis.

BRIEF DESCRIPTION OF THE DRAWINGS

These and other objects, features and many of the attendant advantages of the present invention will be better understood upon a reading of the following detailed description when considered in connection with the accompanying drawings, wherein like parts in each of the several figures are identified by the same reference numerals, and wherein:

FIG. 4 is an enlarged detail of view in plan of a body member employing flexure hinges of the present invention at its opposite ends;

FIG. 5 is a diagrammatic illustration of a stage supported for lineal motion by flexure hinges in accordance with the present invention;

FIG. 6 is a diagrammatic illustration employed to illustrate the deficiency of prior art flexure hinges in supporting stages intended to be moved lineally.

DESCRIPTION OF PREFERRED EMBODIMENTS

Figure 1:
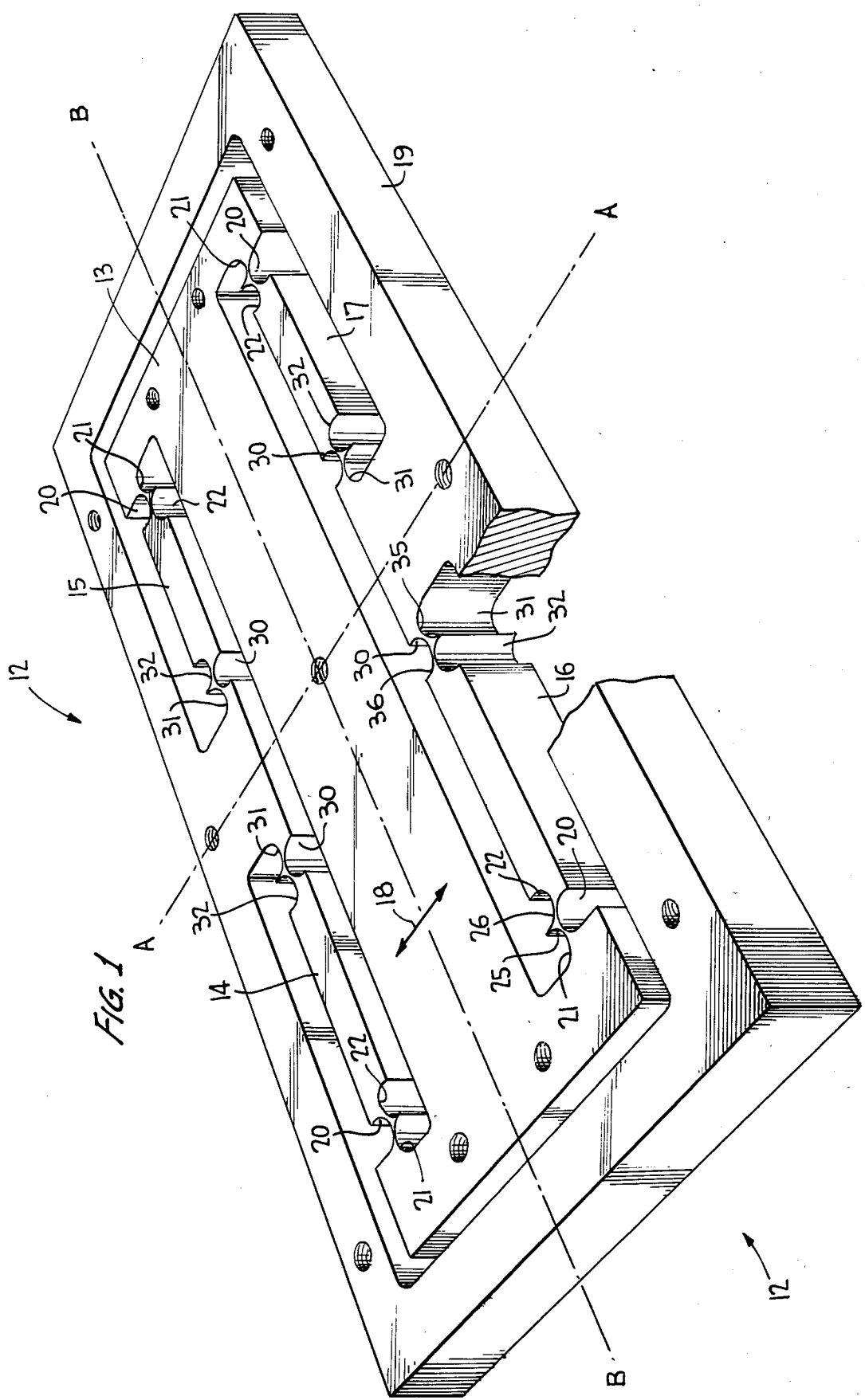
FIG. 1 is a view in perspective of a single axis stage according to the present invention and employing flexure joints according to the present invention.

Referring specifically to FIG. 1 of the accompanying drawings, an instrument stage, which is moveable only in a single dimension represented by arrow 18, includes a frame portion 19 and a stage portion 13. The frame portion 19 and the stage portion 13 are structurally interconnected by means of four body members or arms 14, 15, 16 and 17. Frame 19, stage 13 and all four arms 14, 15, 16 and 17 are formed from a single block 12 of material by means of suitable machining processes. Block 12 from which the unit is formed has a central longitudinal axis A—A extending parallel to the dimension of permitted motion represented by arrow 18, and a central transverse axis B—B extending perpendicular to and co-planar with longitudinal axis A—A. A third dimension of the block 12 is its thickness which is perpendicular to both axes A—A and B—B. The material of block 12 is preferably metal, such as stainless steel, but may be plastic or other similar material, depending upon the particular application for the device. The material, in any case, is of itself not flexible or resilient in the length, width and thickness dimensions of frame 19 and stage 13.

Each of arms 14, 15, 16 and 17 is identical in configuration, although different ends of the various arms are connected to the stage 13 or frame 19, depending upon the location of the arm. One such arm, specifically arm or body member 16, is illustrated in detail in FIG. 4 to which specific reference is now made. Arm 16 has a pair of parallel longitudinally-extending edges 23, 24 which extend parallel to the transverse axis B—B of block 12.

At one end of body member or arm 16, specifically the end connected to stage 13, there is a double flexure hinge member formed by three recesses 20, 21 and 22. Each of these recesses is defined entirely through the thickness dimension of block 12. Recess 20 is cut into edge 24 and extends slightly more than halfway through the arm width. Recesses 21 and 22 are formed in edge 23 in side-by-side relation and likewise extend slightly more than halfway through the width of the arm. Each of recesses 21 and 22 is separated from recess 20 by a thin web or web-like section to form respective flexure hinges. Specifically, recess 21 is spaced from recess 20 by a web 25 to form a flexure hinge of the general type disclosed in the aforementioned Paros, et al. publication. Flexure of this hinge is about an axis extending in the thickness dimension of the block 12 approximately at the thinnest section of the web. Typically, the web has a thickness, at its thinnest section, of $\frac{1}{4}-\frac{1}{2}$ millimeter, or less. A second such web 26 separates recesses 20 and 22 and is spaced lengthwise along arm 16 (transversely or widthwise of block 12) from web 25. Thus, a second flexure hinge is provided which pivots about an axis extending parallel to the pivot axis at web 25, the axis of the second hinge being disposed substantially at the thinnest part of web 26.

In the preferred embodiment of the double flexure hinge, as illustrated, recesses 20, 21 and 22 are arcuate, preferably segments of respective circles. The circumferences of recesses 21 and 22 overlap slightly so that their common terminus 27 is recessed slightly from edge 23 of arm 16. Recesses 21 and 22 are disposed, in the lenghtwise dimension of arm 16, symmetrically on opposite sides of recess 20 so that the terminus 27 resides on an imaginary line which extends transversely of arm 16 and passes through the center of recess 20. Although this configuration is preferred, it should be noted that symmetrical positioning of recess 21 and 22 in relation to recess 20 is not essential for the present invention, and the recesses themselves can be other than arcuate. The important feature is the presence of two flexure webs 25, 26 whose planes are disposed at some angle with respect to each other and which separate one common recess 20 from each of the other two recesses 21 and 22. The extensibility of the hinge is determined by the angular position of webs 25, and 26.

At the opposite end of arm 16, which end joins the arm to frame 19, an identical double flexure hinge is provided. This double hinge includes recess 30, defined through edge 23, and recesses 31 and 32, defined through edge 24. A flexure web 35 separates recesses 30 and 31; a further flexure web 36 separates recess 30 from recess 32. The double flexure hinge 35, 36 formed by recesses 30, 31 and 32 is identical to the double flexure hinge 25, 26 formed by recesses 20, 21 and 22 in all respects except that the common recess 20 for double hinge 25, 26 is formed through edge 24 of arm 16, whereas the common recess 30 of double hinge 35, 36 is formed through opposite edge 23.

It will be appreciated that if frame 19 is positionally fixed, and if a force is applied to stage 13 in a direction transversely of arm 16 (i.e. longitudinally of block 12), and further, if stage 13 is constrained against movement longitudinally of arm 16 (i.e., transversely of block 12), then arm 16 flexes about four spaced parallel axes extending through the thickness of block 12 at webs 25, 26, 35 and 36. The double flexure hinges 25, 26 and 35, 36 permit arm 16 to accomodate single axis movement of the stage relative to the frame by effectively increasing the length of arm 16 slightly. More specifically, assume that the end of arm 16 bearing double hinge 35, 36 is positionally fixed and that the opposite end is moved straight downward (as viewed in FIG. 4). The double flexure at hinge 35, 36 tends to spread recess 30 wider while closing recesses 31 and 32 slightly. At the other end, recess 20 tends to widen while recess 21 and 22 tend to close. The net effect is a pivoting and stretching of arm 16 to accomodate the single dimensional motion of stage 13 relative to frame 19. If stage 13 is moved upwardly (as viewed in FIG. 4), the common recesses 20 and 30 tend to close while the double recesses 21, 22 and 31, 32 tend to widen.

Referring to FIG. 1 once again, in order to constrain stage 13 against movement along axis B—B (i.e., transversely of the intended single axis movement along axis A—A), the four identical arms 14, 15, 16 and 17 are employed. Arms 14 and 15 are disposed on opposite sides of longitudinal axis A—A and symmetrical to one another about that axis. Arms 16 and 17 are also disposed on opposite sides of axis A—A and symmetrical to one another about that axis. This symmetrical arrangement about axis A—A of identical arms 14, 15, 16 and 17 permits each arm to pivot and expand in an identical manner in response to displacement of stage 13 in direction 18 with respect to frame 19. To illustrate this diagrammatically, reference is made to FIG. 5, which can be compared to FIG. 6. Since each of the arms 14, 15, 16 and 17 is pivotable and expandable lengthwise is an identical manner, stage 13 is constrained to move only along axis A—A. The symmetry of the recess pattern that forms each individual flexure, and the symmetry of the four arms 14, 15, 16 and 17 are arranged such that bending forces are equal for rotation of the arms in both directions, therefore constraining the stage 13 to a straight line motion. In addition, the forces generated by moving the compensating control arms through the requisite angles are equal and opposite, thereby eliminating any yaw motion of the stage.

Figure 2:
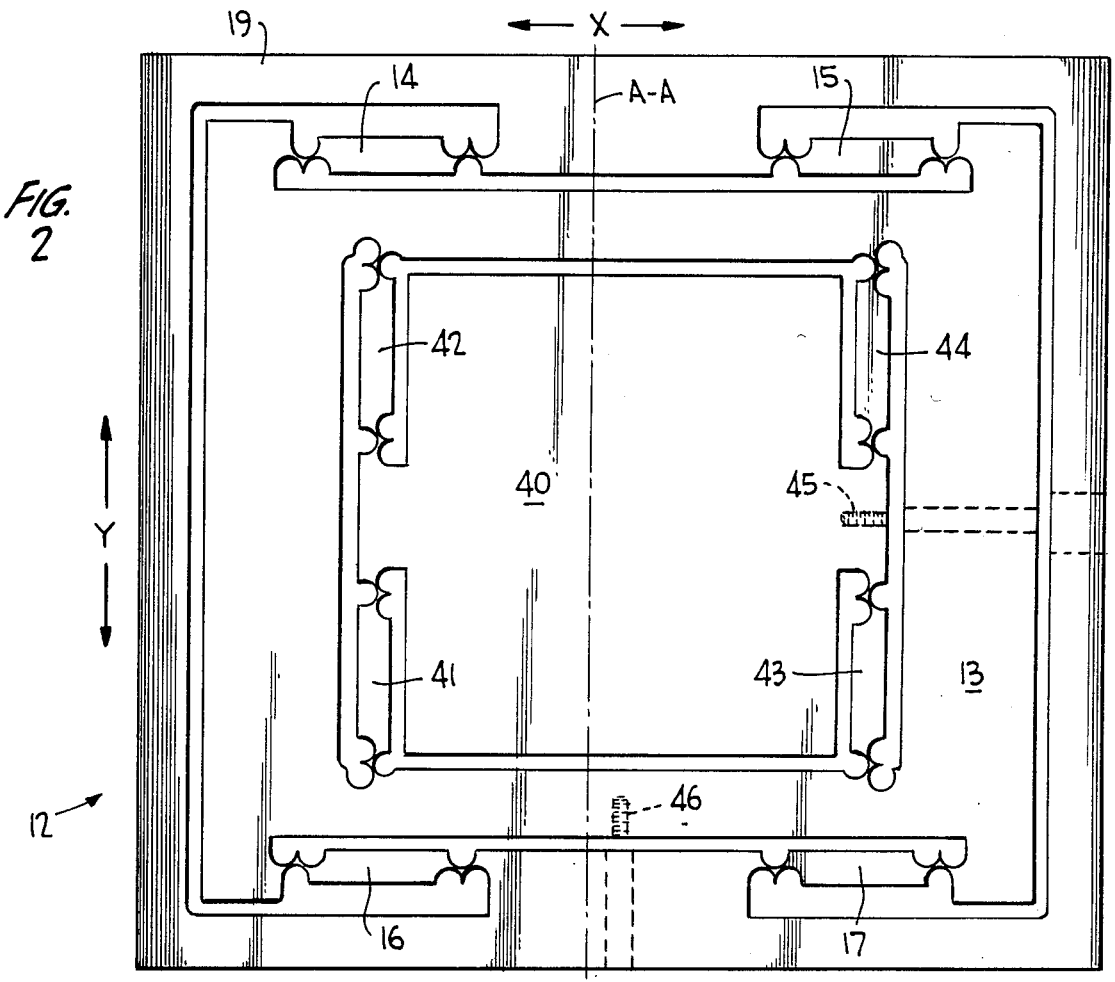
FIG. 2 is a view in plan of a first embodiment of a two-axis stage according to the present invention which employs the flexure joints of the present invention.

Typically, stage 13 is selectively moved along axis A—A relative to frame 19 by means of micrometer-adjustable control which is anchored or otherwise positionally fixed relative to stage 19 and applies forces to move stage 13 relative to the frame in either direction along axis A—A. Typical applications for such control are found in adjustable jigs such as those, for example, which are used to position the stage of a microscope. Such applications generally require two-dimensional movement of the stage, each dimensional movement being independent of the other. For such applications, the two-axis stage of FIG. 2 may be employed. In the embodiment of FIG. 2, the stage 13 serves as a reference frame for a further internal stage 40 which is connected thereto by means of arms or body members 41, 42, 43 and 44. These arms 41, 42, 43 and 44 are identical to arms 14, 15, 16 and 17 and each includes a double flexure hinge at each of its ends. Arms 41, 42, 43 and 44 are positioned in orthogonal relation and co-planar with arms 14, 15, 16 and 17 so that stage 40 is moveable along an axis which is orthogonally related to the axis of movement of stage 13. For ease of reference, movement of stage 13 is represented as being along the y-axis whereas movement of stage 40 is represented as being along the x-axis in FIG. 2. A micrometer control 45 is provided for positioning stage 40 along the x-axis relative to stage 13. A micrometer control is illustrated for positioning stage 13 along the y-axis relative to frame 19. The symmetrical relationships between arms 41, 42, 43 and 44 are identical to the dimensional relationships between arms 14, 15, 16 and 17 as described above, except for the rotation of stage 40 by 90° relative to stage 13. With respect to these symmetrical relationships, it is also desirable that a symmetrical relationship exists between arms 14 and 16 and that a similar dimensional relationship exist between arms 15 and 17. Thus, arm 14 and arm 16 are positioned on opposite sides of transverse axis B—B (in FIG. 1) and are symmetrically disposed with respect to that axis. Likewise, arms 15 and 17 are disposed on opposite sides of axis B—B and are symmetrically disposed with respect to that axis. Analogously, the symmetrical relationships between arms 41, 42, 43 and 44 are as follows: arms 41 and 42 are positioned on opposite sides of axis B—B and are symmetrical with respect thereto; arms 43 and 44 are positioned on opposite sides of axis B—B and are symmetrical with respect thereto; arms 41 and 43 are positioned on opposite sides of axis A—A and are symmetrical with respect thereto; the arms 42 and 44 are positioned on opposite sides of axis A—A and are symmetrical to one another with respect to that axis.

The specific symmetrical relationships described above are not required to achieve the desired independent two-dimensional movement of the two stages, respectively. However, some form of symmetry is required. For example, referring to FIG. 3, a double stage unit is illustrated and is similar to the embodiment of FIG. 2 except that stage 40 has been replaced by stage 50. Arms 51, 52, 53 and 54 of stage 50 serve the same functions as arms 41, 42, 43 and 44, respectively of stage 40. However, the arms of stage 50 are interlaced in order to provide a more compact structure. Specifically, the interlacing of arms 51, 52, 53 and 54 permits stage 50 to be made considerably smaller than stage 40. In this embodiment, as illustrated, each of the arms 51, 52, 53 and 54 extends to both sides of axis B—B while arms 51 and 54 are disposed closer to axis A—A than are arms 52 and 53, respectively. The double flexure hinges disposed at opposite ends of arm 51 are designated by the reference numerals 55 and 56. The hinges for arm 52 are designated by reference numerals 57 and 58. Arm 53 has double flexure hinges 59 and 60 at its ends, while arm 54 has double flexure hinges 61 and 62 at its ends. Although direct symmetry is not present between arms 51, 52, 53, 54, it is noted that double flexure hinge 56 of arm 51 is disposed on the opposite side of motion axis B—B from hinge 58 of arm 52, and that these double hinges are equally spaced from that axis. Likewise, hinge 55 of arm 51 and hinge 57 of arm 52 are disposed at equal distances from axis B—B on opposite sides of that axis. Hinge 60 of arm 53 and hinge 61 of arm 54 are disposed at equal distances on opposite sides of axis B—B as are hinge 59 of arm 53 and hinge 62 of arm 54.

Figure 3:
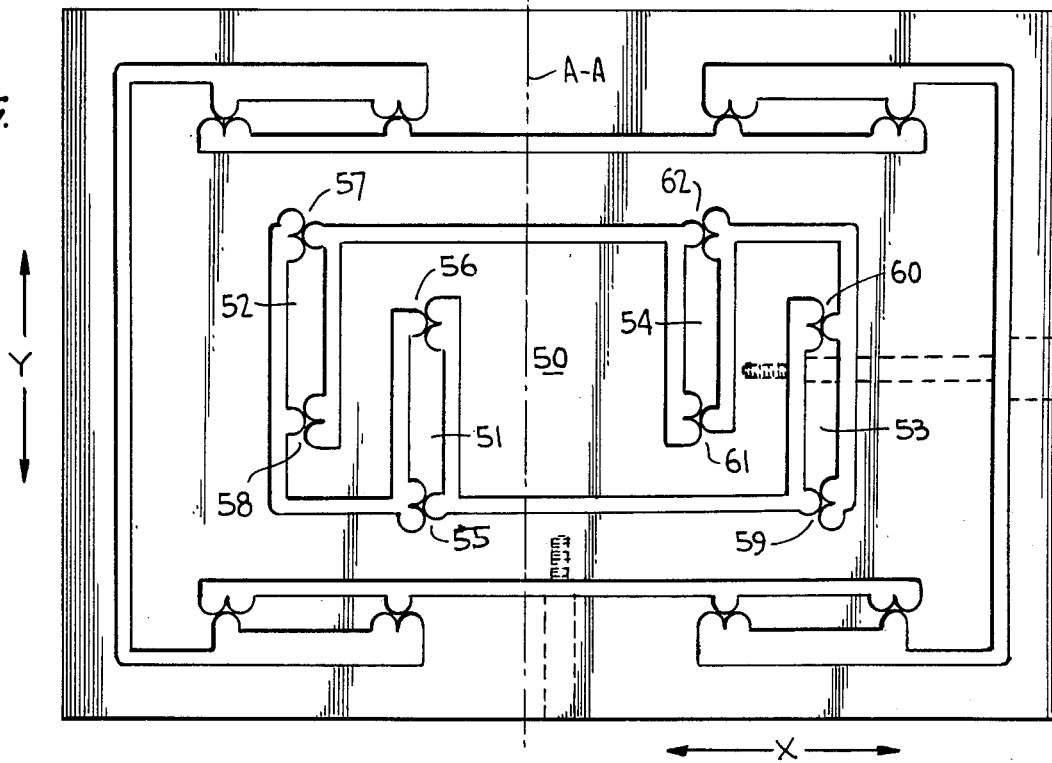
FIG. 3 is a view in plan of another embodiment of the two-axis stage of the present invention which also employs the flexure joints of the present invention.

The instrument stage illustrated in FIGS. 2 and 3 serves as a moving output platform capable of independent x-axis and y-axis motion in a single plane. The motion is virtually free of pitch, roll, yaw and motions perpendicular to the plane of motion.

The stage is ideally suitable for the measurement of surface microtopography. For such application, as noted above, a surface area is accurately surveyed by moving a specimen on the double axis stage under a fixed stylus. The stage must move in a true horizontal plane with vertical deviation less than the stylus instrument background noise level. With the present invention, the combination of precisely located double flexures minimizes vertical path deviations, provides maximum mechanical rigidity and maintains two orthogonal axes of motion within the same horizontal plane while eliminating errors normally associated with stacked slides and the errors of Abbe offset. Transverse motion of each stage is eliminated by the use of the novel double flexure design which permits a compensating variation in the arm lengths of each side of each moving platform as that platform is displaced longitudinally. The particular form of the double flexure joint, namely three adjacent holes forming a pair of generally "V"-shaped webs, permits the necessary stretching and contraction of the flexures to create an effective variation in arm length.

The individual stages can be moved by any of various conventional drive systems. As noted above, a manually operated micrometer screw, with ball-anvil connections may be employed. Likewise, one may employ a stepping motor-controlled micrometer screwdrive, a commercial piezoelectric "inchworm" device, etc.

The stages can be scaled to virtually any size but it must be noted that a practical maximum deflection of any stage is approximately 0.1 times the length of the arm on which the double flexure joints are formed.

While we have described and illustrated specific embodiments of our invention, it will be clear that variations from the details of construction which are specifically illustrated and described may be resorted to without departing from the true spirit and scope of the invention as defined in the appended claims.

What is claimed is:

1. A flexure hinge comprising:
a body member of solid material and having length, width and thickness dimensions, said body member having: first and second generally longitudinally-extending edges and first, second and third recesses defined part-way through said body member in said width dimension and completely through said body member in said thickness dimension, said first recess being defined in said first edge, said second and third recesses being defined in said second edge, said first recess being separated from each of said second and third recesses by respective first and second web portions of said body member which are sufficiently thin to permit flexure of said body member about respective first and second axes extending through said first and second web portions, respectively in said thickness dimension of said body member.

2. The flexure hinge according to claim 1 wherein said second and third recesses are mutually oriented lengthwise of said body member to be symmetrically disposed on opposite sides of said first recess.

3. The flexure hinge according to claim 2 wherein said first, second and third recesses are generally arcuate in the length and width dimensions of said body member.

4. The flexure hinge according to claim 3 wherein said first and second recesses and said third recess extend more than half-way widthwise in the said body member from said first longitudinally-extending edge and said second longitudinally-extending edge, respectively.

5. The flexure hinge according to claim 1 wherein said first, second and third recesses are generally arcuate in the length and width dimensions of said body member.

6. The flexure hinge according to claim 1 wherein said first and second recesses and said third recess each extends more than half-way widthwise into said body member from said first longitudinally-extending edge and said second longitudinally-extending edge, respectively.

7. The flexure hinge according to claim 1 further comprising fourth, fifth and sixth recesses defined part-way through said body member in said width dimension and completely through said body member in said thickness dimension, said fourth recess being defined in said second edge at a location which is displaced lengthwise from said second and third recesses, said fifth and sixth recesses being defined at said first edge at a location which is displaced lengthwise from said first recess, said fourth recess being separated from said fifth and sixth recesses by respective third and fourth web portions which are sufficiently thin to permit flexure of said body member about third and fourth axes, respectively, extending through said third and fourth web portions, respectively, in said thickness dimension of said body member.

8. The flexure hinge according to claim 7 wherein said second and third recesses are mutually oriented lengthwise of said body member to be symmetrically disposed on opposite sides of said first recess, and wherein said fifth and sixth recesses are mutually oriented lengthwise of said body member to be symmetrically disposed on opposite sides of said fourth recess.

9. The flexure hinge according to claim 7 wherein said first and second recesses and said third recess each extend more than half-way widthwise into said body member from said first longitudinally-extending edge and said second longitudinally-extending edge, respectively, and wherein said fourth recess and said fifth and sixth recess extend more than half-way widthwise into said body member from said first longitudinally-extending edge and said second longitudinally-extending edge, respectively.

10. The flexure hinge according to claim 7 wherein said first, second and third recesses are substantially identical in size and configuration to said fourth, fifth and sixth recesses, respectively, and wherein said fifth and sixth recesses are positioned relative to and spaced from said fourth recess in an identical manner to the positioning and spacing of said second and third recesses relative to said first recess.

11. An apparatus comprising a plurality of flexure hinges according to claim 10 and further including:
a support frame defining an interior space;
a first stage member disposed in said interior space;
wherein said plurality of said flexure hinges comprises four flexure hinges, each being positioned with its longitudinal dimension oriented in the same direction and connected between said support frame and said stage member to constitute the only connections between said support frame and said stage member.

12. The apparatus according to claim 11 wherein said support frame, said stage member and said four flexure hinges are all part of an integral block of said solid material.

13. The apparatus according to claim 12 wherein said solid material is metal.

14. The apparatus according to claim 11 wherein said stage member has a transverse axis extending in a width dimension corresponding to an intended dimension of motion of said stage member within said frame, and a longitudinal axis extending perpendicular to an intersecting said transverse axis, wherein a first and second of said four flexure hinges are disposed in mutual symmetrical relation about said transverse axis, wherein a third and fourth of said four flexure hinges are disposed in mutual symmetrical relation about said transverse axis, wherein said first and third flexure hinges are disposed in mutual symmetrical relation about said longitudinal axis, and wherein said second and fourth flexure hinges are disposed in mutual symmetrical relation about said longitudinal axis.

15. The apparatus according to claim 14 wherein said first and second flexure hinges are aligned along their longitudinal dimensions, and wherein said third and fourth flexure hinges are aligned along their longitudinal dimensions.

16. The apparatus according to claim 14 wherein said first stage member has a frame-like configuration surrounding an interior space therein, said apparatus further comprising:
a second stage member disposed in the interior space within said stage member; and four more of said flexure hinges each being positioned with its longitudinal dimension perpendicular to the longitudinal dimensions of said first, second, third and fourth flexure hinges and connected between said first and second stage members to constitute the only connections between said first and second stage members.

17. The apparatus according to claim 15 wherein said second stage member has a first axis oriented perpendicular to the transverse axis and parallel to the longitudinal axis of said first stage member and extending the long and intended direction of motion of said second stage member relative to said first stage member, said second stage member having a second axis oriented parallel to said first axis of said second stage member and perpendicular to said transverse axis of said first stage member, wherein a fifth and sixth of said flexure hinges are disposed in mutual symmetrical relation about said first axis, wherein a seventh and eighth of said flexure hinges are disposed in mutual symmetrical relation about said first axis, wherein said fifth and seventh flexure hinges are disposed in mutual symmetrical relation about said second axis, and wherein said sixth and eighth flexure hinges are disposed in mutual relation about said second axis.

18. The apparatus according to claim 17 wherein said fifth and sixth flexure hinges are misaligned along their longitudinal dimension, and wherein said seventh and eighth flexure hinges are misaligned along their longitudinal dimensions.

19. The apparatus according to claim 17 wherein said first and second flexure hinges are aligned along their longitudinal dimensions, wherein said third and fourth flexure hinges are aligned along their longitudinal dimensions, wherein said fifth and sixth flexure hinges are aligned along their longitudinal dimensions, and wherein said seventh and eighth flexure hinges are aligned along their longitudinal dimensions.

20. The apparatus according to claim 16 further comprising:
first means for selectively applying a force to said first stage member along a direction parallel to said transverse axis;
second means for selectively applying a force to said second stage member along a direction parallel to said first axis;
whereby said first and second stage members are moveable in respective orthogonally related dimensions.

21. The apparatus according to claim 11 wherein said first stage member has a frame-like configuration surrounding an interior space therein, said apparatus further comprising:
a second stage member disposed in the interior space within said first stage member; and
four more of said flexure hinges each being positioned with its longitudinal dimension perpendicular to the longitudinal dimension of said first, second, third and fourth flexure hinges and connected between said first and second stage members to constitute the only connections between said first and second stage members.

22. An instrument stage with a moveable output platform capable of independent motion along mutually perpendicular axes in a single plane, said instrument stage comprising:
a support frame defining an interior space;
a first stage member disposed in said interior space and defining an interior region;
first support means for securing said first stage member to said frame to permit relative motion of said first stage member relative to said frame only along a first axis;
a second stage member disposed in said interior region of said first stage member;
second support means for securing said second stage member to said first stage member to permit relative motion of said second stage member to said first stage member only along a second axis which is perpendicular to and co-planar with said first axis;
wherein said first support means comprises first and second flexure hinges secured between said support frame and said first stage member and disposed symmetrically about said first axis, and third and fourth flexure hinges secured between said support frame and said first stage member and disposed symmetrically about said first axis;
wherein said second support means comprises fifth and sixth flexure hinges secured between said first and said second stage members and disposed symmetrically about said second axis, and seventh and eighth flexure hinges secured between said first and second stage members and disposed symmetrically about said second axis;
wherein each of said flexure hinges is an elongated member having first and second ends and is longitudinally resiliently stretchable while being pivotable about each of its first and second ends.

23. The instrument stage according to claim 22 wherein each of said flexure hinges comprises:
a body member of solid material and having length, width and thickness dimensions, said body member having: first and second generally longitudinally-extending edges, and first, second and third recesses defined part-way through said body member in said width dimension and completely through said body member in said thickness dimension, said first recess being defined in said first edge, said second and third recesses being defined in said second edge, said first recess being separated from each of said second and third recesses by respective first and second web portions of said body member which are sufficiently thin to permit flexure of said body member about respective first and second axes extending through said first and second web portions, respectively, in said thickness dimension of said body member.

24. An instrument stage comprising:

a support frame defining an interior space;

a stage member disposed in said interior space;

support means for securing said stage member to said frame to permit motion of said stage member relative to said frame only along one axis;

wherein said support means comprises first and second flexure hinges secured between said support frame and said stage member and disposed symmetrically about said axis, and third and fourth flexure hinges secured between said support frame and said stage member and disposed symmetrically about said axis;

wherein each of said flexure hinges is an elongated member having first and second ends and is longitudinally resiliently stretchable while being pivotable about each of its first and second ends; and wherein each of said flexure hinges comprises:

a body member of solid material and having length, width and thickness dimensions, said body member having: first and second generally longitudinally-extending edges and first, second and third recesses defined part-way through said body member in said width dimension and completely through said body member in said thickness dimension, said first recess being defined in said first edge, said second and third recesses being defined in said second edge, said first recess being separated from each other of said second and third recesses by respective first and second web portions of said body member which are sufficiently thin to permit flexure of said body member about respective first and second axes extending through said first and second web portions, respectively, in said thickness dimension of said body member.

* * * * *